United States Patent
Hotchkiss

(12) 
(10) Patent No.: US 6,239,013 B1
(45) Date of Patent: May 29, 2001

(54) METHOD FOR TRANSFERRING PARTICLES FROM AN ADHESIVE SHEET TO A SUBSTRATE

(75) Inventor: Gregory B. Hotchkiss, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/253,655

(22) Filed: Feb. 19, 1999

Related U.S. Application Data

(60) Provisional application No. 60/075,207, filed on Feb. 19, 1998.

(51) Int. Cl.[7] .................................................. H01L 21/44
(52) U.S. Cl. ..................... 438/616; 438/612; 438/613; 438/615; 257/737; 257/738; 257/780; 257/781
(58) Field of Search ........................... 438/616, 612–615, 438/51, 55, 64, 106–108; 257/737, 738, 780, 781

(56) References Cited

U.S. PATENT DOCUMENTS

| | | | | |
|---|---|---|---|---|
| 3,719,981 | * | 3/1973 | Steitz | 438/612 |
| 5,356,751 | * | 10/1994 | Cairncross et al. | 430/253 |
| 5,909,634 | * | 6/1999 | Hotchkiss et al. | 438/612 |

FOREIGN PATENT DOCUMENTS

| | | | | |
|---|---|---|---|---|
| 9-82719 | * | 3/1997 | (JP) | H01L/21/321 |
| 9-326412 | * | 12/1997 | (JP) | H01L/21/60 |

* cited by examiner

*Primary Examiner*—Charles Bowers
*Assistant Examiner*—Erik J Kielin
(74) *Attorney, Agent, or Firm*—Gary C. Honeycutt; Fred Telecky; Arthur I. Navarro

(57) ABSTRACT

A method for attaching particles (12) to a substrate (14), comprising the steps of aligning particles (12) attached to an adhesive sheet (35) with contact pads (42) of a substrate (14), transferring thermal energy (38) to the adhesive sheet (35) by maintaining a temperature below the melting point of particles (12), and removing the adhesive sheet (35) prior to reflow, is disclosed. The adhesive sheet (35) may be composed of an adhesive coating (22) laminated to a film (24). The particles may be composed of a variety of compositions, including compounds such as solder or plastic, for example.

6 Claims, 4 Drawing Sheets

METHOD FOR TRANSFERRING PARTICLES FROM AN ADHESIVE SHEET TO A SUBSTRATE

This application claims the benefit of Provisional Application 60/075,207 filed Feb. 19, 1998.

TECHNICAL FIELD OF THE INVENTION

The present invention relates in general to the field of electronic device packages and more particularly to a method and apparatus for attaching electrically conductive particles to a substrate.

BACKGROUND OF THE INVENTION

Without limiting the scope of the invention, its background is described in connection with electronic device packaging, as an example.

Modern electronic components utilize numerous integrated circuits. These integrated circuits are electrically connected to each other or to other electronic components. One method for connecting integrated circuits to electronic components utilizes an area array electronic package, such as a ball-grid array (BGA) package or a flip-chip package. The electrical connections between an integrated circuit packaged in an area array package design and a printed circuit board (PCB) are typically composed of solder.

With ball grid array packages, various input and output ports of an integrated circuit are typically connected via wire bonds to contact pads of the ball grid array electronic package. Solder balls formed on the contact pads of the ball grid array electronic package are used to complete the connection to another electronic component, such as a printed circuit board (PCB).

Integrated circuits are also connected to electronic components through a flip-chip electronic package design. The flip-chip electronic package is similar to the ball grid array electronic package in that solder balls are used to make a connection with other electronic components, such as a PCB. Solder balls are also used in a flip-chip design to attach the input and output ports of the substrate to the contact pads of the integrated circuit. As such, flip-chip packages do not require wire bonds. These solder balls or bumps may be formed on the face of integrated circuits as they reside on semiconductor wafers before being sawed into individual dies.

Therefore, an important step in the interconnection of many electronic components is the formation and attachment of solder balls.

Heretofore, in this field, solder bumps or balls have been typically formed utilizing one of four methods: (1) printing of solder paste through a stencil or mask; (2) electroplating; (3) evaporation; or (4) mechanical transfer of preformed solder spheres. While electroplating, printing of solder paste through a stencil or mask, and evaporation techniques have been typically utilized for forming solder bumps on wafers and integrated circuits, BGA and chip-scale packages (CSP) have commonly utilized printing of solder paste and mechanical transfer of solder ball techniques.

Transfer of solder balls has been customarily achieved by means of vacuum chucks or machined templates. Another method for transferring preformed solder balls utilizes formation of a pattern of dots onto a photoimageable coating laminated to an organic film. Typically the organic film is composed of a material having a high melting temperature that is capable of being exposed to temperatures exceeding 200 C. with very little degradation, such as polyimide.

The pattern is formed by placing a photomask on the coating and then exposing the coating to a dose of ultraviolet radiation. For example, for an area array package design, the photomask contains a mirror image of the contact pads design. The areas protected by the photomask design retain their adhesiveness while the unprotected areas exposed to the ultraviolet radiation lose their adhesiveness. The array of adhesive areas corresponds to the pattern of contact pads found on the substrate, wafer or die to receive the solder connections.

After the adhesive areas are formed, solder balls are loaded onto the surface of the film and attach to the adhesive areas. The excess solder balls that lie on non-adhesive areas are removed. The populated film is then aligned and brought into contact with contact pads, which may be fluxed. A solder reflow is performed to transfer the solder balls from the adhesive areas to the contact pads of the substrate. Following the reflow cycle, the film is removed from the solder balls.

SUMMARY OF THE INVENTION

It has been discovered that leaving the organic film or polyimide carrier in contact with the solder balls during reflow results in several problems. For example, flux residues generated during the reflow process have been trapped underneath the polyimide. The residue has often formed large deposits on the solder balls and substrate. These large deposits have made removal by cleaning more difficult.

In addition to flux residue, adhesive residue from the organic film has been left on the solder balls. Removal of the organic film prior to reflow may decrease the adhesive residue left on the solder balls.

Moreover, the polyimide sheet has pressed against the molten solder balls, creating flat tops which have required a second reflow to correct and conform to customers' specifications. An additional reflow process increases the cycle time as well as the costs of manufacturing. A second reflow may not be necessary in the absence of the polyimide sheet.

In addition, the organic film is composed of a material that has a high melting temperature and is capable of being exposed to temperatures exceeding 200 C. with very little degradation. One such material is polyimide; however, polyimide is significantly more expensive than other organic films such as Mylar® which are less capable of withstanding exposure to solder reflow temperatures. Removing the organic film before reflow may allow the substitution of cheaper organic films, thereby reducing manufacturing costs.

Also, the polyimide sheet has been apt to stretch or grow with increasing temperature according to its coefficient of thermal expansion. The thermal expansion may be non-uniform, resulting in wrinkling or sagging of the polyimide sheet. The wrinkling has flattened solder balls and has caused them to agglomerate together in clusters. The wrinkling has also caused the solder balls to push other solder balls off the contact pads, which may result in a non-functional device.

Furthermore, the photopolymer has reacted adversely to certain chemicals contained in the solder flux. The trapping of the fluxes by the polyimide sheet may exacerbate the situation, resulting in more unwanted reactions among the flux, photopolymer, and solder balls.

Therefore, a need has arisen for a method of attaching metal or solder balls to a substrate that overcomes the problems in the prior art. A need has also arisen for an apparatus for manufacturing an integrated circuit package that overcomes the problems in the prior art.

The present invention comprises a method for transferring metal or solder particles from an adhesive sheet to a substrate comprising the steps of obtaining an adhesive sheet having a plurality of adhesive areas, loading the particles onto the adhesive sheet, removing the particles not adhered to the adhesive areas, aligning the particles on the adhesive sheet with contact pads of the substrate, transferring thermal energy to the adhesive sheet, removing the adhesive sheet from the particles prior to reflow, and securely attaching the particles to the contact pads using reflow techniques, for example. In one embodiment of the present invention, the step of transferring thermal energy comprises maintaining a temperature less than the melting point of the particles.

The present invention also comprises an apparatus for manufacturing an integrated circuit package, comprising an adhesive sheet heated to a temperature less than the melting point of the particles and a plurality of particles connected to the adhesive sheet.

BRIEF DESCRIPTION OF THE DRAWINGS

For a more complete understanding of the features and advantages of the present invention, reference is now made to the detailed description of the invention along with the accompanying figures in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
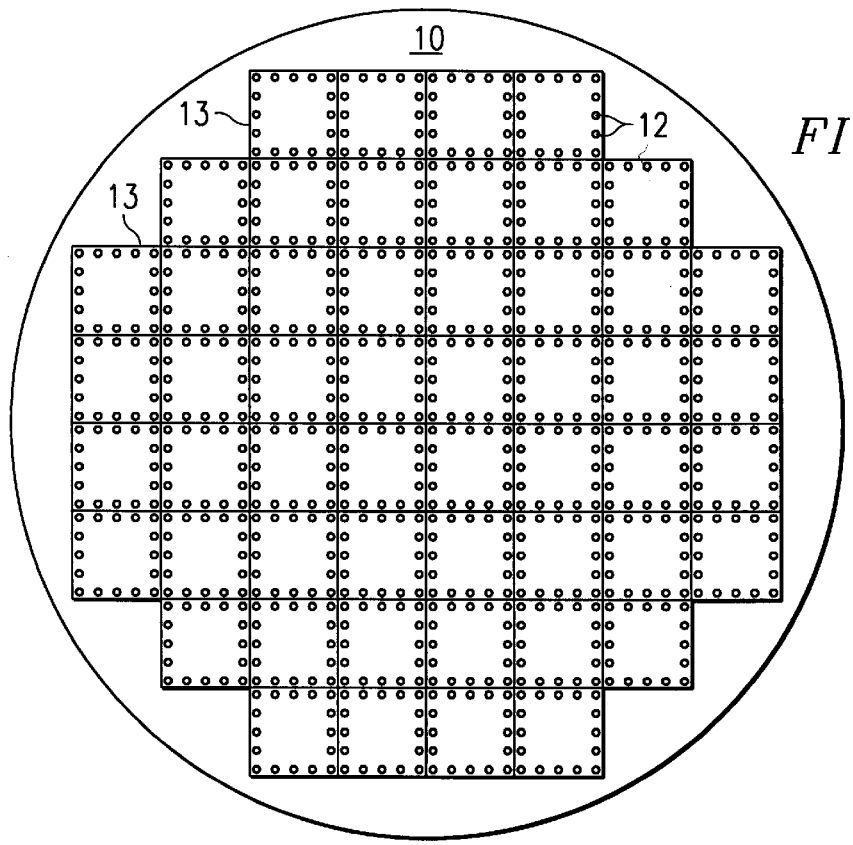
FIG. 1 is a plan view of a semiconductor wafer with solder particles attached thereon in accordance with the present invention.

Reference is now made to FIG. 1, which depicts a semiconductor wafer 10 with solder particles 12 attached thereto in accordance with the present invention. Solder particles 12 are typically attached to contact pads (not explicitly shown in FIG. 1) of semiconductor wafer 10. Semiconductor wafer 10 may be composed of silicon, gallium arsenide, or any other semiconductor material used in electronic device manufacturing. Semiconductor wafer 10 may be divided into a plurality of dies 13 for use in electronic components.

Particles 12 are generally discrete, free-flowing particles that may have a variety of compositions. For example, particles 12 may be composed of solder alloys including combinations of tin, lead, silver, bismuth, copper, indium, antimony, and cadmium; however, other suitable conductive materials may be used including any of these metals used separately, or synthetic compounds such as plastic. Alloy coated metal particles are also useful.

Solder particles 12 are typically solder spheres having a diameter in a range of approximately 3 mils to approximately 30 mils; however, it should be appreciated by persons skilled in the art that the principles of the present invention are applicable to solder particles 12 of other dimensions and configurations, such as rectangular or cylindrical columns.

Also, solder particles 12 may be attached directly to other substrates, such as an interposer or an integrated circuit in a flip-chip package. Electronic substrates or interposers consist of an insulating material having electrically conductive paths extending through the interposer from the surface to the opposite surface forming electrical entry and exit paths.

Figure 2:
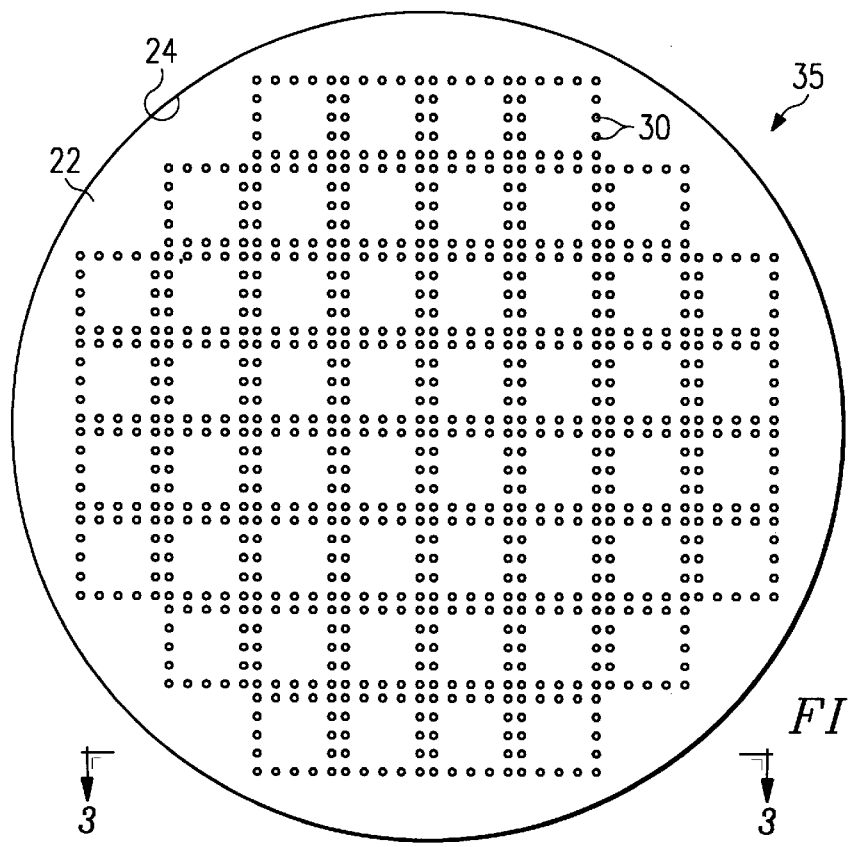
FIG. 2 is a plan view of a wafer-scale adhesive sheet for use in the present invention.
Figure 3:
FIG. 3 is a cross-sectional view along line 3—3 of the adhesive sheet of FIG. 2.

FIG. 2 depicts an adhesive sheet for use in the present invention generally designated as 35. In one embodiment of the invention, adhesive sheet 35 comprises a photoimageable adhesive coating 22 laminated onto a film 24 such as Kapton® or Mylar®, for example, as shown in the cross-sectional view of FIG. 3. Adhesive coating 22 is typically 4 to 6 microns thick, and film 24 is typically 50 microns thick; however, it should be understood by one skilled in the art that the principles of the present invention are applicable to varying thicknesses.

In forming adhesive sheet 35, photolithography may be utilized to create a plurality of discrete adhesive areas 30 corresponding to a pattern of contact pads. A more complete description of adhesive patterns formed utilizing photolithography is described in U.S. Pat. No. 5,356,751, issued to Cairncross, et. al., the contents of which are incorporated herein by reference.

The diameter of adhesive areas 30 is typically approximately half of the diameter of solder particles 12; however, it should be appreciated by one skilled in the art that the principles of the present invention are applicable to adhesive areas 30 of other dimensions. Furthermore, while adhesive areas 30 are depicted in FIG. 2 as circular areas suitable for receiving spherical solder particles 12, it should be appreciated by persons skilled in the art that adhesive areas 30 may have a variety of other configurations, including oval, square, and rectangular.

Figure 4A:
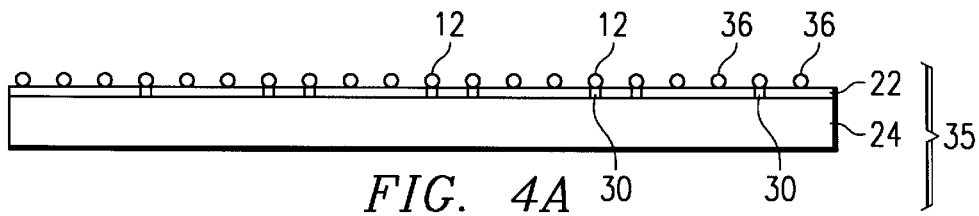
FIG. 4A is a cross-sectional view of an adhesive sheet with solder particles attached thereto in accordance with the present invention.

In accordance with the present invention, solder particles 12 are loaded, or transferred, onto adhesive sheet 35, as depicted in FIG. 4A. A plurality of solder particles 12, including excess solder particles 36, is loaded onto adhesive sheet 35. Solder particles 12 are captured and retained by adhesive areas 30. Excess solder particles 36 lie on non-adhesive portions of adhesive sheet 35.

Figure 4B:
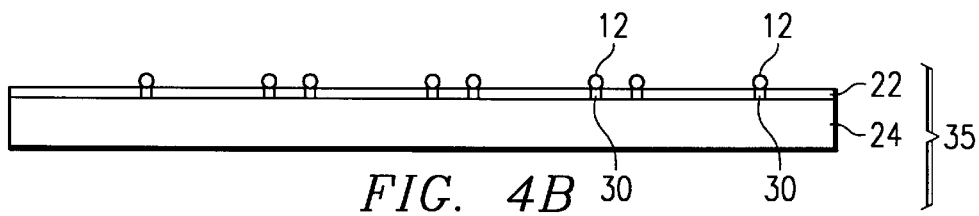
FIG. 4B is a cross-sectional view of a fully populated adhesive sheet in accordance with the present invention.

A fully populated adhesive sheet 35 is shown in FIG. 4B. To ensure that a solder particle 12 adheres to each adhesive area 30, kinetic energy may be applied to forcibly spread solder particles 12 over the entire surface of adhesive sheet 35. A gas stream or mechanical device may be used to remove any excess solder particles 36 (not shown in FIG. 4B). Thus, each of the solder particles 12 is attached to each of the adhesive areas 30, as depicted in FIG. 4B; all excess solder particles 36 have been removed, and none of solder particles 12 are clinging together.

Figure 5:
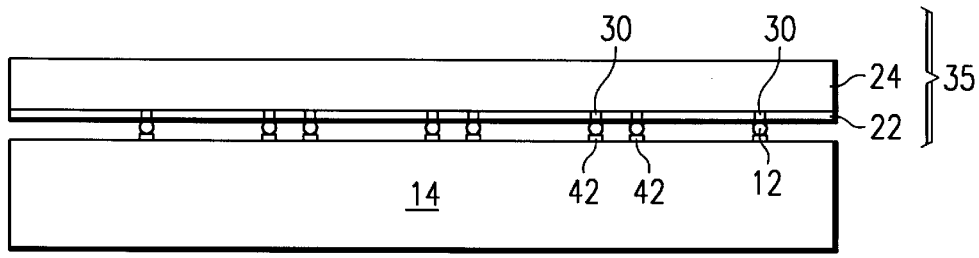
FIG. 5 is a cross-sectional view of solder particles aligned with contact pads of a substrate in accordance with the present invention.

Turning now to FIG. 5, the alignment of contact pads 42 of substrate 14 with solder particles 12, which are attached to adhesive areas 30 of adhesive sheet 35, is depicted. Contact pads 42 may be fluxed with soldering flux to help retain solder particles 12 during removal of adhesive sheet 35. Alignment may be achieved utilizing mechanical or optical systems as should be known by one skilled in the art.

Figure 6:
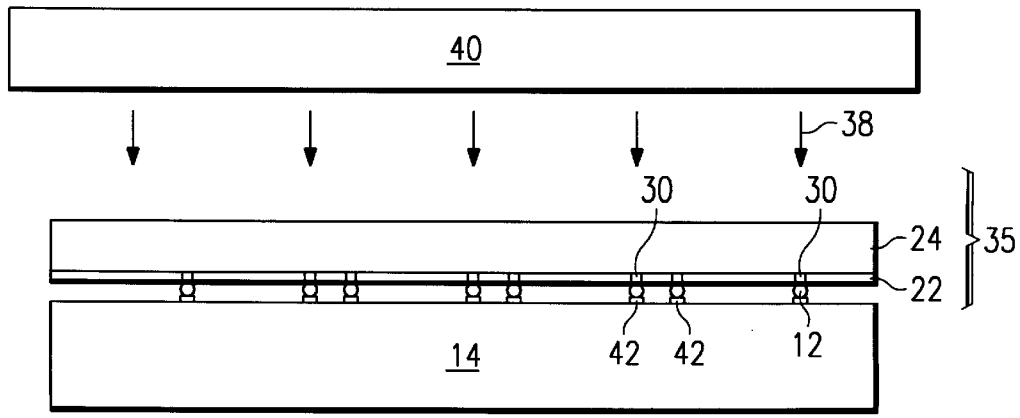
FIG. 6 is a cross-sectional view of a thermal energy source above an adhesive sheet with solder particles attached thereto and aligned with contact pads of a substrate in accordance with the present invention.

A feature of the present invention is the step of applying thermal energy 38 emitted from thermal energy source 40 to adhesive sheet 35, as shown in FIG. 6. Exposure to thermal energy 38 degrades the adhesiveness of adhesive areas 30, thereby improving the transfer of solder particles 12 to contact pads 42 by minimizing the impact of removing adhesive sheet 35 from solder particles 12.

Thermal energy source 40 may consist of a variety of mechanisms, such as optical heating lamps (e.g. tungsten-halogen), a hot plate, radiator, infrared heaters, or other similar devices. Thermal energy 38 may be conductively transferred to adhesive sheet 35 via direct contact of thermal energy source 40 with adhesive sheet 35. Alternatively, thermal energy 38 may be radiantly or convectively transferred to adhesive sheet 35.

The temperature should be kept below the melting point of solder particles 12. The temperature could be any temperature below the melting point of solder particles 12 depending upon the chemical composition of adhesive sheet 35.

Alternatively, adhesive sheet 35 may be exposed to radiation while solder particles 12, attached to adhesive areas 30 of adhesive sheet 35, are in close aligned proximity to contact pads 42. Exposure to ultraviolet radiation, for example, significantly degrades the adhesiveness of adhesive areas 30, thereby facilitating the removal of adhesive sheet 35 from solder particles 12. Such exposure allows removal of adhesive sheet 35 with less disturbance and interference to the shape and integrity of solder particles 12.

When exposing adhesive sheet 35 to radiation, adhesive sheet 35 should be comprised of a material that permits transmission of radiation. For example, polyimide would not be a suitable material for use with ultraviolet radiation, as polyimide blocks transmission of ultraviolet radiation.

Figure 7A:
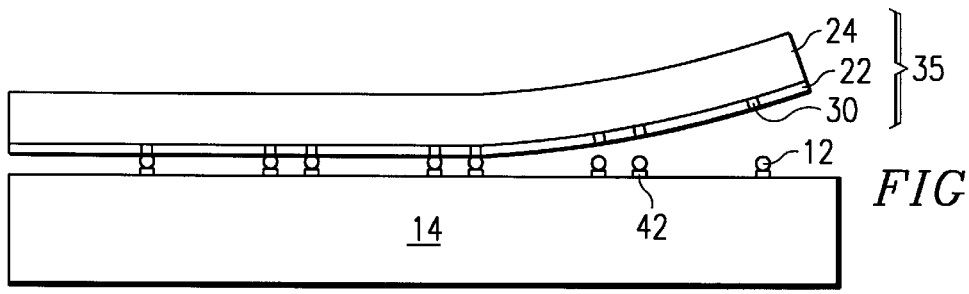
FIG. 7A is a cross-sectional view of the removal of an adhesive sheet from solder particles residing on contact pads of a substrate in accordance with the present invention.

Following exposure to thermal energy source 40 or radiation, adhesive sheet 35 may be removed from solder particles 12 as shown in FIG. 7A.

Significant improvement is obtained by removal of adhesive sheet 35 after application of thermal energy 38 or radiation and prior to reflow in accordance with the present invention. For example, one improvement is the absence of excessive amounts of solder flux residue from solder particles 12 and the surface of substrate 14. Furthermore, removal of adhesive sheet 35 prior to reflow avoids the problem of trapping solder fluxes that may react adversely with the composition of adhesive sheet 35. Removal of adhesive sheet prior to reflow also decreases the adhesive residue left on solder particles 12.

Removal of adhesive sheet 35 prior to reflow also eliminates the wrinkling that effects flattened solder particles. Thus, where solder particles 12 are spherical, the need for an additional reflow cycle to round up flattened solder particles 12 is eliminated by the present invention. Elimination of an unnecessary cycle along with a reduction in cycle time, in turn, reduces operational costs.

Finally, removal of adhesive sheet 35 prior to reflow allows use of materials other than polyimide that would otherwise melt or degrade during reflow absent prior removal. Adhesive sheet 35 is discarded after one use, and thus can add significantly to costs of manufacturing. Use of substitute materials such as Mylar®, which are far less expensive than polyimide, may significantly reduce manufacturing costs.

Solder particles 12 used in the present invention may be securely attached to contact pads 42 using a variety of solder reflow systems, such as an optical heating reflow system, a vapor phase solder reflow system, or other solder reflow systems. In an optical heating reflow system, radiant heat from near infrared optical sources such as tungsten-halogen lamps may be utilized for rapid thermal ramping with minimal thermal inertia, thereby shortening cycle time.

The amount of heat supplied by the lamps is directly proportional to the supplied voltage. For example, higher voltage settings result in hotter temperatures. Voltage input to the optical sources may be programmed to precisely match a prescribed temperature versus time profile. The heat from the infrared optical sources may uniformly heat substrate 14 with temperatures sufficient to melt solder particles 12 to form a metallurgical bond with contact pads 42.

With a vapor phase solder reflow system, vapor condenses to surround substrate 14 with a cloud of steam. A liquid, such as a nonchlorinated (non CFC) fluorocarbon is first heated with enough energy to form a vapor and to sustain a vapor cloud. When substrate 14 is then passed through the vapor, the vaporized liquid condenses thereon and gives off the latent heat of vaporization. This energy is then transferred to substrate 14. As long as substrate 14 remains in the vapor, the vapor continues to give off energy at a repeatable fixed rate and temperature, until substrate 14 reaches the temperature of the vapor.

Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the preferred temperatures of non-chlorinated fluorocarbons that are used as vapor fluids is shown below in conjunction with the composition of the solder type to be used. In one embodiment the composition of each of solder particles 12 is about 60% Pb (lead) and 40% Sn (tin), as this composition provides a strong adhesion between integrated circuit packages or between an integrated circuit package and a board, such as a motherboard, daughterboard or module board. Using the 60% Pb/40% Sn composition also dispenses with the need to provide solder paste on a solder pad, again due to the strong adhesion of the 60% Pb/40% Sn composition. Alternately, a variety of other materials may be used as solder particles 12, such as those described in the following chart. Solder particles 12 of the following compositions may be used with other solder reflow techniques.

| Vaporization Temperatures and Solder Types | |
|---|---|
| Liquidus Temperature | Solder Type |
| 56, 80, 97, 101, 102 C. and 155 C. | 100 In |
| | 37 Sn/38 Pb/25 In |
| 165 C. | 70 Sn/18 Pn/12 In |
| | 70 In/30 Pb |
| 174 C. | 60 In/40 Pb |
| 190 C. | 90 In/10 Ag |
| | 50 In/50 Pb |
| | 63 Sn/37 Pb |
| | 70 Sn/30 Pb |
| | 60 Sn/40 Pb |
| 215 C. and 230 C. | 60 Sn/40 In |
| | 60 Sn/40 Pb |
| | 63 Sn/37 Pb |

-continued

Vaporization Temperatures and Solder Types

| Liquidus Temperature | Solder Type |
|---|---|
|  | 70 Sn/30 Pb |
|  | 62 Sn/36 Pb/2 Ag |
| 240 C. and 253 C. | 75 Pb/25 In |
|  | 81 Pb/19 In |
| 260 C. and 265 C. | 96.5 Sn/3.5 Ag |

With an infrared or radiant heated solder reflow technique, each component of the soldering system is directly exposed to radiation from a heating element. Heat from the radiant energy element is absorbed by the different components according to its molecular structure.

Figure 7B:
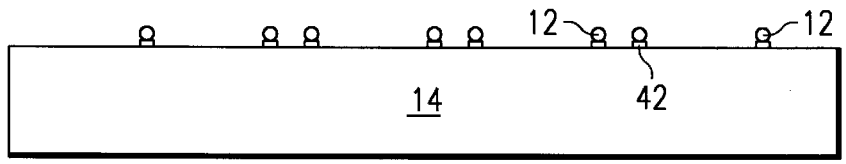
FIG. 7B is a cross-sectional view of a substrate with solder particles attached in accordance with the present invention.

Reflow of solder particles 12 results in substrate 14 with solder particles 12 attached to contact pads 42, as depicted in FIG. 7B. Substrate 14 may be used in a variety of integrated circuit packages, such as a ball grid array package, a flip-chip package, or an interposer. Substrate 14 may also be a semiconductor wafer 10, as shown in FIG. 1, or a die 13 of semiconductor wafer 10.

Figure 8:
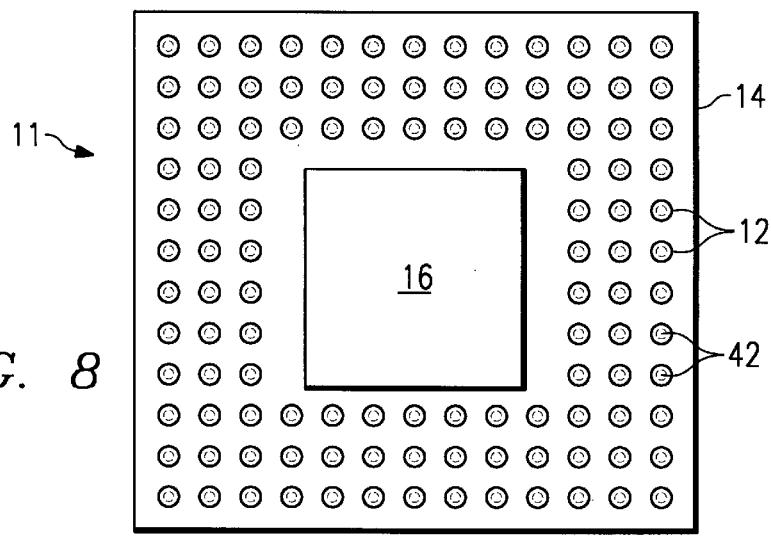
FIG. 8 is a plan view of a ball grid array package manufactured utilizing the principles of the present invention.

Reference is now made to FIG. 8, in which an exemplary ball grid array package is shown and generally designated as 11. In one embodiment, the present invention provides a method and apparatus for attaching a plurality of particles 12 to a substrate 14. Solder particles 12 are typically attached to contact pads (not explicitly shown in FIG. 1) of substrate 14. Ball grid array package 11 is formed with an integrated circuit receiving area 16 for placement of an integrated circuit.

Ball grid array package 11 may be a conventional ball grid array package. Examples of conventional ball grid array substrate materials include organic laminates, ceramics, metals, and polymeric sheets and films. Ball grid array package 11 may also be any suitable substrate to which solder particles may be attached to facilitate electrical connection of electronic devices.

Figure 9:
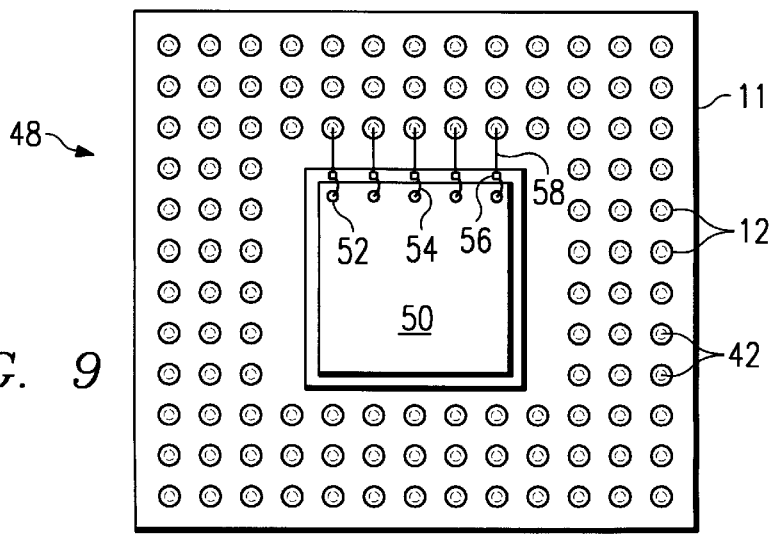
FIG. 9 is a plan view of an integrated circuit package utilizing the principles of the present invention.

Reference is now made to FIG. 9, which depicts a plan view of an exemplary integrated circuit package 48 utilizing an attachment-ready ball grid array package 11 in accordance with the invention. Integrated circuit package 48 comprises ball grid array package 11 with an integrated circuit 50 attached thereto. Bond pads 52 are electrically connected via wire bonds 54 to pads 56 on ball grid array package 11. Pads 56 are electrically connected to contact pads 42 via electrically conductive interconnect lines 58. Interconnect lines 58 may be patterned in one or more layers, with some of the interconnect lines 58 placed below the surface of ball grid array package 11. To protect the integrated circuit from the potentially corrosive nature of the atmosphere, the region surrounding integrated circuit 50, wire bonds 54, and bond pads 56 may be filled with polymeric material. Therefore, the formation of solder particles 12 on contact pads 42 facilitates electrical connection between integrated circuit 50 and another component, such as a printed circuit board.

Figure 10:
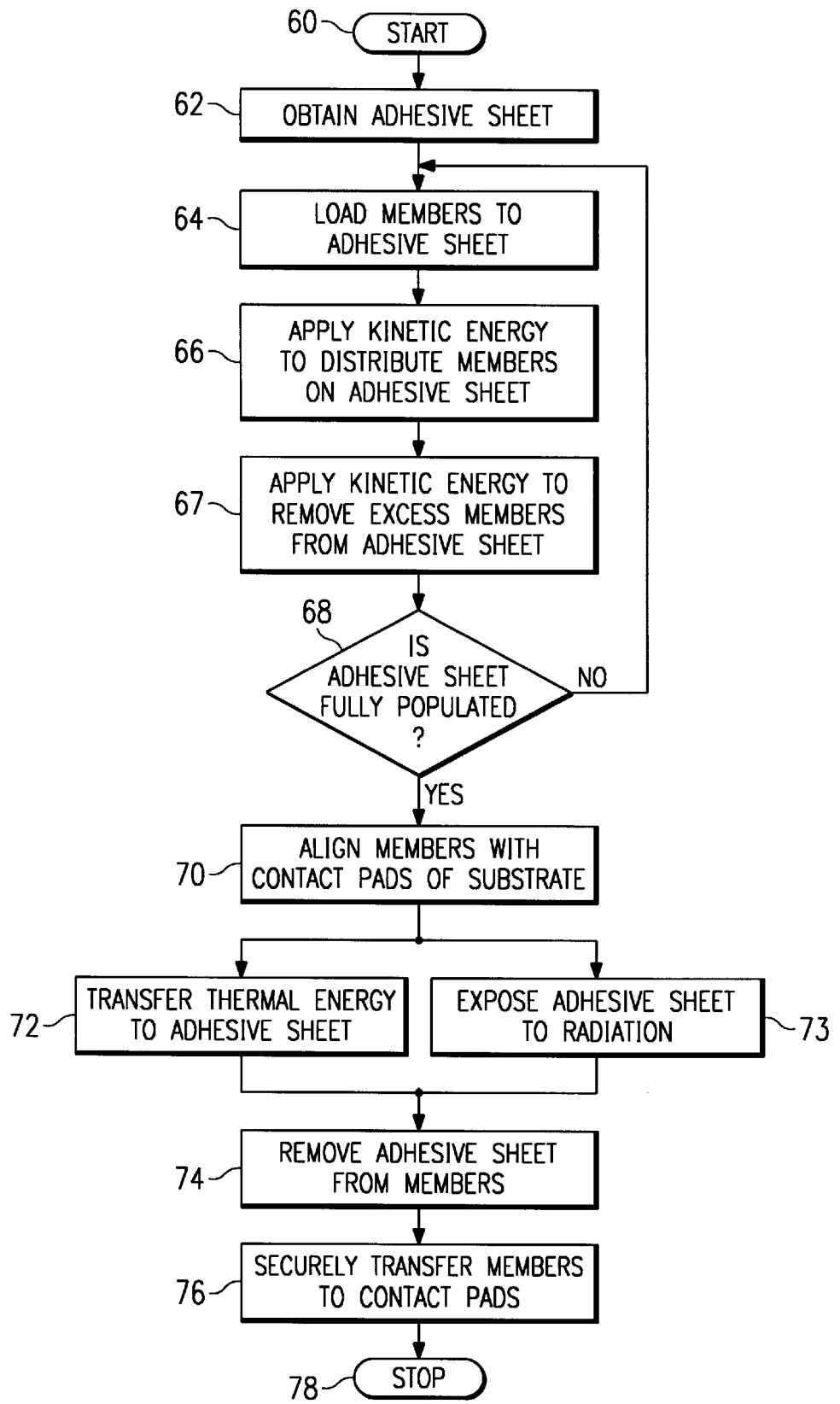
FIG. 10 is a process flow diagram of a method of attaching solder particles to a substrate in accordance with the present invention.

FIG. 10 is a process flow chart for the attachment of solder particles 12 to a substrate 14. The method step begins in step 60. According to the invention, in step 62, an adhesive sheet 35 is obtained having a surface with a pattern of adhesive areas 30 that corresponds to the pattern of contact pads 42. In step 64, solder particles 12 are loaded onto the surface of adhesive sheet 35, as described with reference to FIGS. 4A and 4B.

Solder particles 12 and excess solder particles 36 may be distributed on the surface of adhesive sheet 35 in step 66 by application of kinetic energy, for example. Next, in step 67, excess solder particles 36 are removed from adhesive sheet 35, by application of kinetic energy, for example, as described with reference to FIGS. 4A and 4B. In decision 68, if adhesive sheet 35 is not fully populated, then process steps 64, 66, and 67 may be repeated until full population is achieved.

Upon full population of adhesive sheet 35, process flow proceeds to step 70, in which solder particles 12 attached to adhesive sheet 35 are aligned with substrate 14 such that each of the solder particles 12 comes in contact with a contact pad 42 of substrate 14 as described with reference to FIG. 5. Next, in step 72, thermal energy 38 is conductively, convectively, or radiantly transferred from thermal energy source 40 to adhesive sheet 35, as described with reference to FIG. 6. Alternatively, in step 73, radiation may be applied to adhesive sheet 35. In step 74, as described with reference to FIG. 7A, adhesive sheet 35 is removed from solder particles 12, which are in close aligned proximity to contact pads 42 of substrate 14 such that solder particles 12 remain disposed upon contact pads 42. Solder particles 12 are then securely attached to contact pads 42 in step 76 via reflow, for example, in a manner of choice as described with reference to FIG. 7B. Process flow ends at step 78.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for transferring particles from an adhesive sheet to a substrate, comprising the steps of:

obtaining the adhesive sheet having the particles attached thereto;

positioning the particles in close aligned contact with contact pads of the substrate;

exposing the adhesive sheet to ultraviolet radiation; and removing the adhesive sheet from the particles before reflow such that the particles remain in contact with said contact pads; and then reflowing the particles.

2. The method as recited in claim 1, wherein the particles are composed of solder alloy.

3. The method as recited in claim 1, wherein the particles are composed of synthetic compounds.

4. The method as recited in claim 1, wherein the substrate is a semiconductor wafer.

5. A method for transferring solder particles from an adhesive sheet to a substrate, comprising the steps of:

obtaining an adhesive sheet having a plurality of adhesive areas;

loading the solder particles to said adhesive sheet;

removing the solder particles not adhered to said adhesive areas;

aligning the solder particles on said adhesive sheet with contact pads of the substrate;

exposing said adhesive sheet to ultraviolet radiation;

removing said adhesive sheet from the solder particles; and thereafter securely attaching the solder particles to said contact pads.

6. The method as recited in claim 5 wherein the step of securely attaching the solder particles further includes reflowing the solder particles.

* * * * *